(12) United States Patent
Memering et al.

(10) Patent No.: US 9,777,397 B2
(45) Date of Patent: Oct. 3, 2017

(54) CONTINUOUS SAPPHIRE GROWTH

(71) Applicant: Apple Inc., Cupertino, CA (US)

(72) Inventors: Dale N. Memering, San Francisco, CA (US); Scott A. Myers, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 1305 days.

(21) Appl. No.: 13/631,602

(22) Filed: Sep. 28, 2012

(65) Prior Publication Data

US 2014/0090592 A1    Apr. 3, 2014

(51) Int. Cl.
*C30B 15/34* (2006.01)
*C30B 29/20* (2006.01)
*C30B 15/00* (2006.01)
*C30B 15/30* (2006.01)
*C30B 33/06* (2006.01)

(52) U.S. Cl.
CPC ............ *C30B 15/34* (2013.01); *C30B 15/002* (2013.01); *C30B 15/005* (2013.01); *C30B 15/30* (2013.01); *C30B 29/20* (2013.01); *C30B 33/06* (2013.01); *Y10T 117/1004* (2015.01); *Y10T 117/106* (2015.01); *Y10T 117/1032* (2015.01); *Y10T 225/12* (2015.04)

(58) Field of Classification Search
CPC combination set(s) only.
See application file for complete search history.

(56) References Cited

U.S. PATENT DOCUMENTS

| | | | | |
|---|---|---|---|---|
| 3,293,002 | A | * 12/1966 | Spielmann | C30B 15/00 117/32 |
| 4,095,647 | A | 6/1978 | Asselman et al. | |
| 4,248,645 | A | * 2/1981 | Jewett | C30B 15/34 117/14 |
| 4,303,465 | A | 12/1981 | Bagdasarov et al. | |
| 4,335,081 | A | * 6/1982 | Sachs | C30B 15/005 110/173 R |
| 4,681,718 | A | 7/1987 | Oldham | |

(Continued)

FOREIGN PATENT DOCUMENTS

| | | | | |
|---|---|---|---|---|
| DE | 4200185 | * 7/1992 | ........... C30B 15/002 |
| JP | 53073481 | 6/1978 | |

(Continued)

OTHER PUBLICATIONS

Machine translation of DE4200185.*

(Continued)

*Primary Examiner* — Duy Deo
*Assistant Examiner* — Erin Bergner
(74) *Attorney, Agent, or Firm* — Brownstein Hyatt Farber Schreck, LLP

(57) ABSTRACT

Systems and methods for continuous sapphire growth are disclosed. One embodiment may take the form of a method including feeding a base material into a crucible located within a growth chamber, heating the crucible to melt the base material and initiating crystalline growth in the melted base material to create a crystal structure. Additionally, the method includes pulling the crystal structure away from crucible and feeding the crystal structure out of the growth chamber.

18 Claims, 8 Drawing Sheets

(56) References Cited

U.S. PATENT DOCUMENTS

| | | | | |
|---|---|---|---|---|
| 5,820,649 | A * | 10/1998 | Ogure | C30B 15/002 117/13 |
| 6,066,279 | A | 5/2000 | Walls et al. | |
| 6,152,211 | A | 11/2000 | Klug et al. | |
| 6,368,525 | B1 | 4/2002 | Klug et al. | |
| 7,713,896 | B2 | 5/2010 | Henneck et al. | |
| 2005/0268655 | A1 * | 12/2005 | Butts | C03B 17/068 65/29.12 |
| 2008/0075941 | A1 * | 3/2008 | Tatartchenko | C30B 15/14 428/220 |
| 2008/0245292 | A1 * | 10/2008 | Outwater | C30B 15/34 117/23 |
| 2011/0083789 | A1 * | 4/2011 | Nakazono | B32B 41/00 156/64 |
| 2011/0256377 | A1 * | 10/2011 | Chiruvolu | C30B 15/007 428/220 |
| 2011/0302962 | A1 * | 12/2011 | Gattermann | C03B 5/225 65/29.21 |

FOREIGN PATENT DOCUMENTS

| | | | |
|---|---|---|---|
| JP | S53-073481 A † | 6/1978 | |
| JP | 59097593 | 6/1984 | |
| JP | 10158088 | 6/1998 | |
| JP | H10-158088 A † | 6/1998 | |
| JP | 2002305316 | 10/2002 | |
| JP | 2004-039931 A † | 2/2004 | |
| JP | 2004039931 | 2/2004 | |
| JP | 3601791 | 12/2004 | |
| JP | 3601791 B2 † | 12/2004 | |
| JP | 2008501605 | 8/2008 | |
| JP | 4245856 | 4/2009 | |
| JP | 4245856 B2 † | 4/2009 | |
| JP | 2010504274 | 2/2010 | |
| JP | 2010540390 | 12/2010 | |
| JP | 4618426 | 1/2011 | |
| JP | 4618426 B2 † | 1/2011 | |
| JP | 2011502099 | 1/2011 | |
| JP | 2011504451 | 2/2011 | |
| WO | 2005/121034 A2 † | 12/2005 | |
| WO | WO2005121034 | 12/2005 | |
| WO | 2008/036888 A1 † | 3/2008 | |
| WO | WO2008036888 | 3/2008 | |
| WO | 2009/058293 A1 † | 5/2009 | |
| WO | 2009/067641 A2 † | 5/2009 | |
| WO | WO2009058293 | 5/2009 | |
| WO | WO2009067641 | 5/2009 | |

OTHER PUBLICATIONS

U.S. Appl. No. 13/623,645, filed Sep. 20, 2012, Christopher D. Prest.

U.S. Appl. No. 14/172,375, filed Feb. 4, 2014, Douglas Weber.

\* cited by examiner

† cited by third party

CONTINUOUS SAPPHIRE GROWTH

TECHNICAL FIELD

The present application is directed to sapphire growth and, more particularly, to systems and methods for continuous sapphire growth.

BACKGROUND

Corundum is a crystalline form of aluminum oxide and is found in various different colors, all of which are generally commonly referred to as sapphire except for red corundum which is commonly known as ruby and pinkish-orange corundum which is known as padparadscha. Transparent forms of corundum are considered precious stones or gems. Generally, corundum is extraordinarily hard with pure corundum defined to have 9.0 Mohs and, as such, is capable of scratching nearly all other minerals.

As may be appreciated, due to certain characteristics of corundum, including its hardness and transparent characteristics, among others, it may be useful in a variety of different applications. However, the same characteristics that are beneficial for particular applications commonly increase both the cost and difficulty in processing and preparing the sapphire for those applications. As such, beyond costs associated with it being a precious stone, the costs of preparing the corundum for particular uses is often prohibitive. For example, the sapphire's hardness makes cutting and polishing the material both difficult and time consuming when conventional processing techniques are implemented. Further, conventional processing tools such as cutters experience relatively rapid wear when used on corundum.

SUMMARY

Systems and methods for continuous sapphire growth are disclosed. One embodiment may take the form of a method including feeding a base material into a crucible located within a growth chamber, heating the crucible to melt the base material and initiating crystalline growth in the melted base material to create a crystal structure. Additionally, the method includes pulling the crystal structure away from crucible and feeding the crystal structure out of the growth chamber.

Another embodiment may take the form of a system for continuous sapphire growth including a vertical growth chamber and a crucible positioned within the growth chamber. The crucible includes a die set and is configured to hold molten alumina. The system also includes a heater configured to heat the crucible and a feeding system for continuously feeding alumina into the crucible. A pulling system is provided and configured to contact a seed crystal with molten alumina at the top of the die set and pull a crystal ribbon upwardly and out of the growth chamber.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Generally, all sapphire growth methods are batch in nature. At the start of each growth cycle, at a minimum, a precisely oriented seed crystal is positioned within the growth chamber and contacted with molten alumina to propagate crystal growth. Often the growth furnace is cooled and the crucible refilled with alumina prior to each new growth cycle.

The present continuous growth techniques helps to avoid down-time associated with the batch methods by eliminating all but the initial seeding operations, and eliminating the need to cool and re-heat the crucible. Equipment up time could be greatly increased as down time would only occur to replace worn components (something that generally does not occur until after many growth cycles). Further energy costs may be reduced by eliminating and/or reducing the cooling and heating cycles of the conventional batch processing techniques.

The present continuous growth method is based upon the EFG (edge-defined film fed growth) process. In this process, 'ribbons' of sapphire are grown by pulling them through a die set that defines the shape of the solidifying crystal. This process is typically a batch process because of either the emptying of the crucible through growth of crystals or by the length of grown ribbon reaching a maximum as allowed by the growth chamber.

To convert the process into a continuous process, alumina may be continuously fed into the crucible and the growth chamber may be configured to open up to allow the sapphire ribbon to pass through. This introduces several new problems. In particular, the growth chamber is typically filled with an inert gas during growth. The open top would allow that gas to escape. Additionally, heat would tend to escape from the top of the chamber, thereby reducing efficiency. Further, the sapphire ribbons are generally pulled via an actuator holding the seed crystal, and this would not be able to continue pulling upwards indefinitely.

To address these issues, several mechanisms may be implemented. First, sets of precise rollers could be introduced near the top of the furnace to take over pulling the continuous sapphire ribbons after an initial pull by an actuator. Second, beyond the rollers, a seal mechanism could close the gaps around and in between the ribbons to minimize heat and gas loss. Additionally, by making the furnace tall, the effect of heat loss could be significantly separated from the hot zone and crystallization points to minimize effect. This would also allow the ribbons sufficient time within the chamber to slowly cool without developing significant thermal induced stresses. Third, the slow leak of gas from a seal could be compensated for by a continuous input of inert gas. Also, by positioning the seals above the rollers, any friction effects from the seal would be separated by the rollers from the growth point, minimizing their effects.

Figure 1:
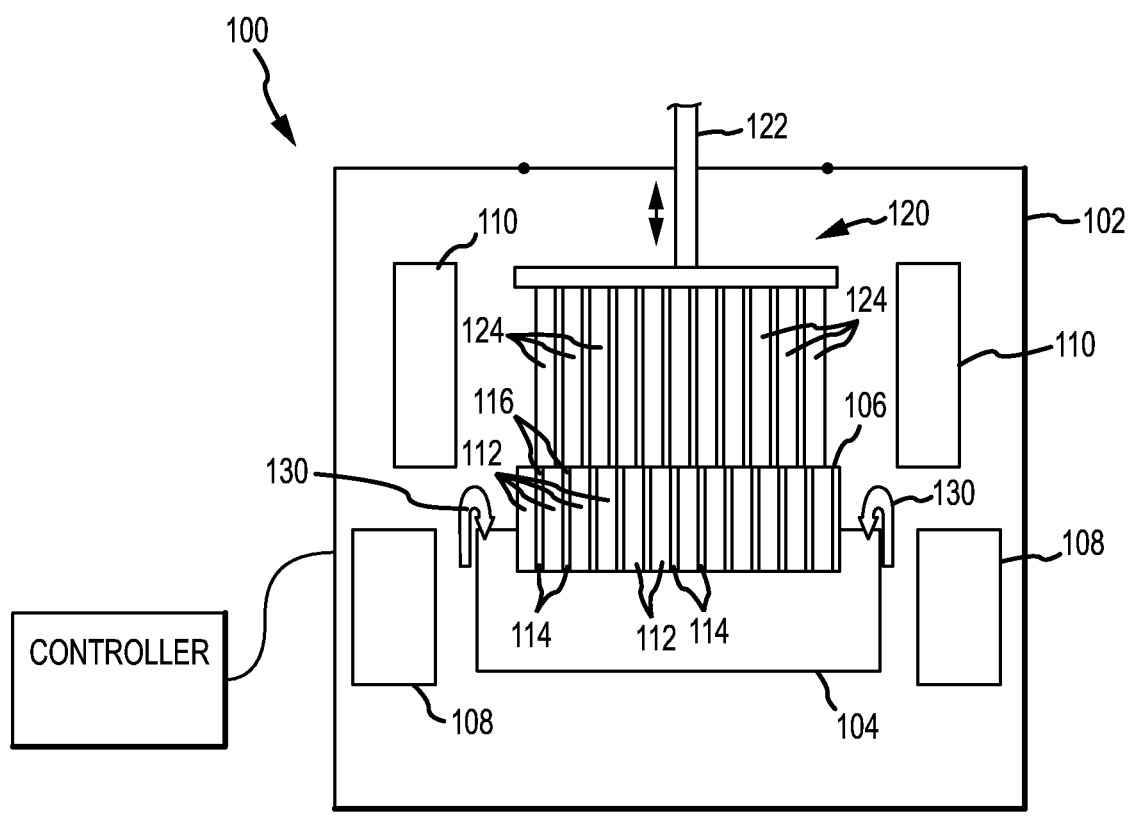
FIG. 1 illustrates an example continuous crystal growth system in accordance with an example embodiment.

Turning to FIG. 1, a continuous sapphire growth system 100 is illustrated. The growth system 100 may generally be constructed to grow sapphire in accordance with the EFG process. However, it should be appreciated that aspects of this example embodiment may be implemented in other sapphire growth processes to achieve continuous or nearly continuous sapphire growth.

The continuous sapphire growth system 100 includes a growth chamber 102 that houses the component parts that facilitate sapphire growth. Specifically, the chamber 102 houses a crucible 104, a die set 106, heaters 108, and insulation 110. The crucible 104 configured to hold molten alumina. The crucible 104 may be heated by the heater 108 to temperatures above the melting point of alumina so that the alumina remains in a molten state. The heater 108 may generally take any suitable form, and in one embodiment may take the form of one or more electric heaters. In some embodiments, a preheating system (not shown) may be implemented to help efficiently bring the temperature of the crucible 104 and/or the growth chamber 102 to a first temperature level before the heater 108 raises the temperature to above the melting point of alumina.

Generally, the die set 106 may include multiple sets of parallel plates 112. Each set of parallel plates 112 forms a slit 114 which draws the molten alumina upward through capillary action. Each set of parallel plates 112 includes a die tip 116 located at the top of the plates 112. The die tip 116 determines the shape of a crystal formed from the molten alumina drawn up the slits 114 of the parallel plates 112.

A pulling system 120 is provided which is configured to pull the crystal from the die tip 116. In some embodiments, the pulling system 120 may be configured to move within the growth chamber 102, whereas in other embodiments the pulling system is fixed at or near the top of the growth chamber. In still other embodiments, the pulling system may be positioned at some point above the crucible 104 within the growth chamber. In further embodiments, the pulling system or parts of the pulling system may be positioned outside of the growth chamber 102.

In FIG. 1, the pulling system 120 may be configured to move vertically within the growth chamber 120. A support member 122 may be coupled to the pulling system 122 and configured to move the pulling system vertically. The pulling system 120 may include a plurality of pulling mechanisms, each corresponding to a die tip of the die set. Each pulling mechanism may initially support a seed crystal. The pulling system 120 may be lowered so that the seed crystal is in contact with the molten alumina at the die tip so that crystal growth is propagated. Once crystal growth is initiated, the pulling system 120 is pulled away from the crucible and crystal ribbons 124 are pulled upwardly from the die set.

Figure 2:
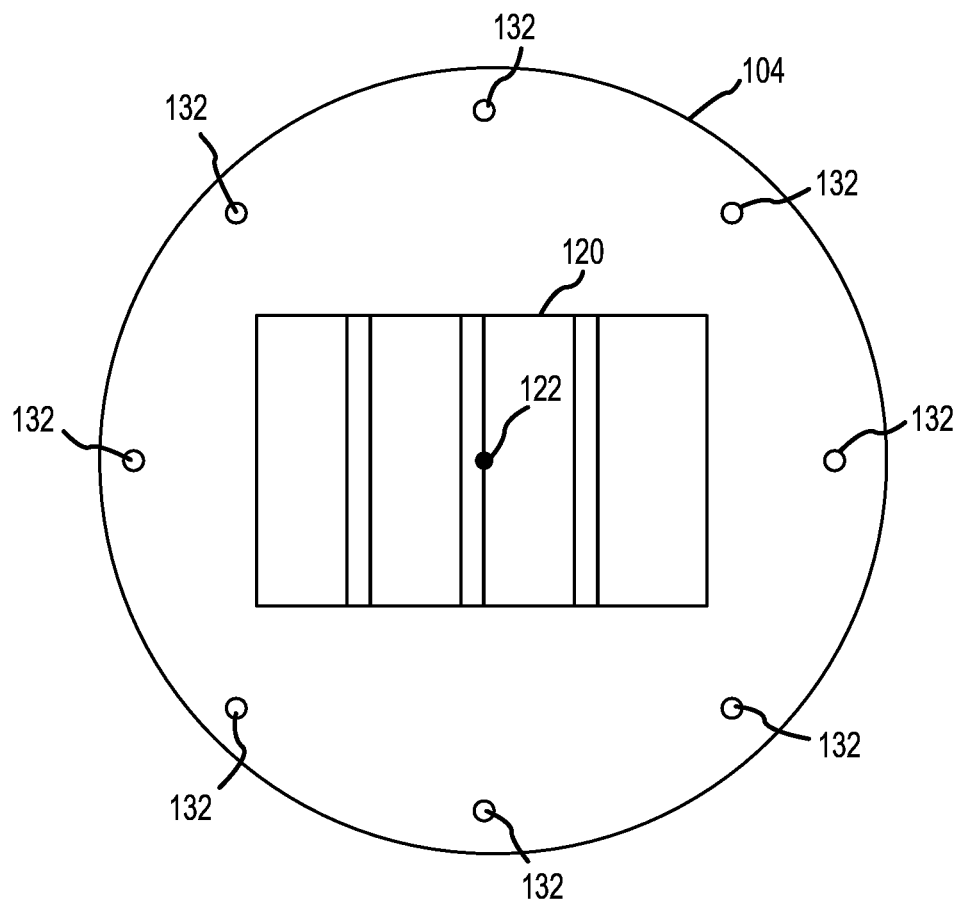
FIG. 2 is a top-down view of a crucible of the continuous growth system of FIG. 1 showing inlets for continuous feeding of alumina.

As the crystal ribbons 124 are pulled upwardly, the molten alumina in the crucible is used up. The molten alumina is replenished by feeding alumina into the crucible 104 at a rate corresponding to the rate at which crystal is grown. Arrows 130 illustrate the feeding of the alumina into the crucible 104. The alumina may generally be fed into the crucible in a solid form. As may be appreciated, the feeding of the solid alumina into the molten alumina will have a slight cooling effect on the molten alumina. In one embodiment, the alumina is fed into the crucible 104 at multiple locations equidistantly located about the perimeter of the crucible. Thus, the cooling effects are evenly distributed. FIG. 2 is a top-down view of the crucible 104 showing the inlet points 132 for the alumina being evenly distributed about the perimeter of the crucible. In other embodiments, more or fewer inlets 132 may be provided. Additionally, in some embodiments, the inlets 132 may be located at positions other than about the periphery of the crucible 104. For example, one or more inlets may be located more inwardly from the periphery and/or near the center of the crucible 104.

Returning to FIG. 1, the system 100 may include a controller 156 that is configured to control the various operations of the system 100. For example, the controller 156 may control the speed of the pulling system 120, the rate at which alumina is fed into the crucible 104, as well as the temperature of the crucible and/or the growth chamber 102. Additionally, the controller 156 may control the supply of inert gas that fills the growth chamber 102. Generally, the growth chamber is filled with an inert gas such as argon. As some inert gas will be lost through the present process, a supply of the inert gas may be provided to maintain proper conditions within the growth chamber 102. Generally, the controller 156 may include a processor coupled to memory with inputs and outputs that enable the controller to control one or more operations of the system 100 autonomously in accordance with a set of desired operation parameters. In some embodiments, the controller 156 may take the form of a desktop computer, a laptop computer or other such computing device. In such embodiments, the controller 156 may be configured to allow user input to help modify operating parameters. Further, the controller may record operations of the system 100 and provide reports to a user. In other embodiments, the controller 156 may take the form of an application specific integrated circuit or a system on a chip device.

Figure 3:
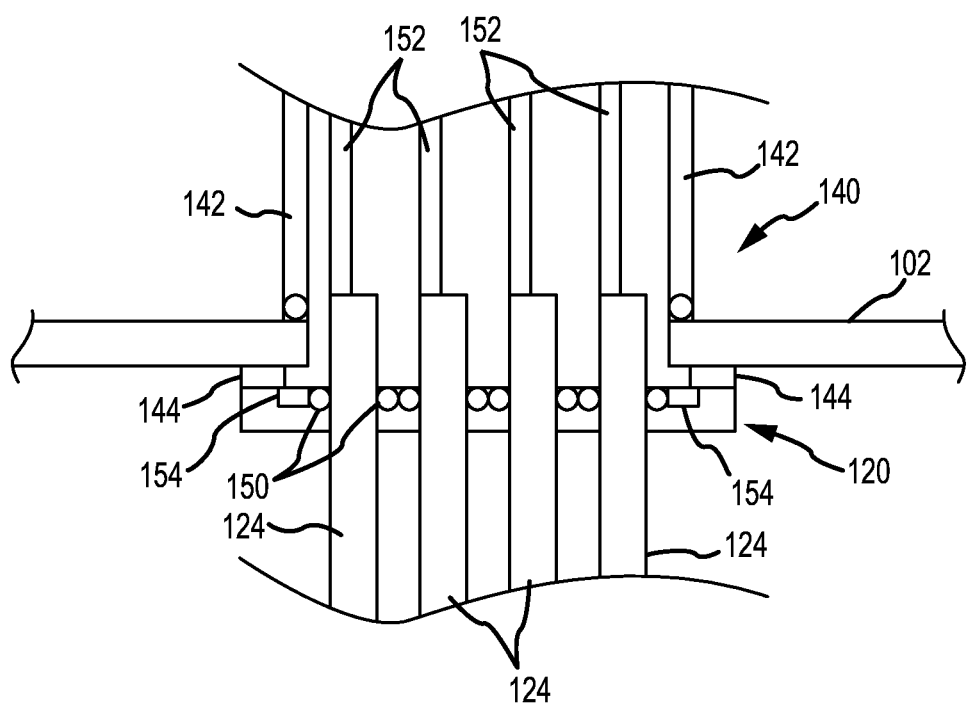
FIG. 3 illustrates zoomed in view of the continuous growth system with crystal ribbons exiting a growth chamber.

Referring to FIG. 3, the pulling system 120 is illustrated as having reached the top of the growth chamber 102. In the illustrated embodiment, the growth chamber 102 may have a convertible top 140 which is configured to open to allow the crystal ribbons 124 to pass through. As illustrated, the convertible top 140 may take the form of hinged doors 142 that open to allow the crystal ribbons 124 pass through. In other embodiments, the convertible top 140 may take other forms. For example, the convertible top 140 may include one or more sliding members that open the top 140. Generally, any suitable mechanism for opening the top 140 to allow the crystal ribbons 124 to pass through may be implemented.

One or more insulative features 144 or seals may be provided to help provide a thermal and/or gas seal for between the pulling system 120 and the top 140 of the growth chamber 102. The insulative features 144 may take the form of a gasket that may be affixed to either the pulling system 120 of to an internal side of the top 140 of the growth chamber 102. The insulative features 144 may take other suitable forms, however. Additionally insulative features or seals may be provided adjacent to the crystal ribbons 124 to help prevent gas and/or heat from escaping from the growth chamber 102 while the crystal ribbon exits.

In some embodiments, the pulling system 120 may include one or more sets of rollers 150 for each crystal ribbon 124 to move the ribbons after the pulling system has reached the top 140 of the growth chamber 102. The rollers 150 may be configured to engage a lead 152 which may support the seed crystal initially. The rollers 150 may thus be configured to help lower the seed crystal to contact the molten alumina. Additionally, the rollers 150 may operate once the pulling system 120 reaches the top 140 of the growth chamber 102 to pull the crystal ribbons 124 from the crucible 104 and push them out of the growth chamber. Alternatively, the rollers 150 may be configured to engage the sapphire ribbons 124 after the pulling system 120 reaches the top 140 of the growth chamber 102. That is, the rollers 150 may not be in contact with the lead 152 and/or the ribbons 124 until the pulling system 120 has reached the top 140 of the growth chamber 102. As such, the rollers 150 may be articulated from a rest position to an engaged position. The articulation may be achieved through any suitable technique. Further, as the lead 152 and the ribbons 124 may have different dimensions, the rollers 150 may be configured to move and/or otherwise adjust to the different sizes. For example, the rollers 150 may be spring loaded.

The rollers 150 may be driven by tunable motors (not shown). Additionally, the rollers 150 may include torque sensors 154 that are configured to sense the torque on the rollers and/or the amount of force being applied to the ribbon 124. Generally, it is desirable to maintain a relatively constant amount of force pulling the ribbons 124 to help avoid breakage. Additionally, the constant force helps maintain a desired thickness and/or growth rate of the ribbon to help reduce or eliminate the creation of defects in the ribbon. As such, each set of rollers 150 may include one or more sensors 154 configured to sense forces and/or perturbations that may result in defective growth. The sensors 154 may be in communication with the controller 156 of FIG. 1. The controller 156 may, in turn, control the operation (e.g., the speed) of the rollers 150.

Figure 4:
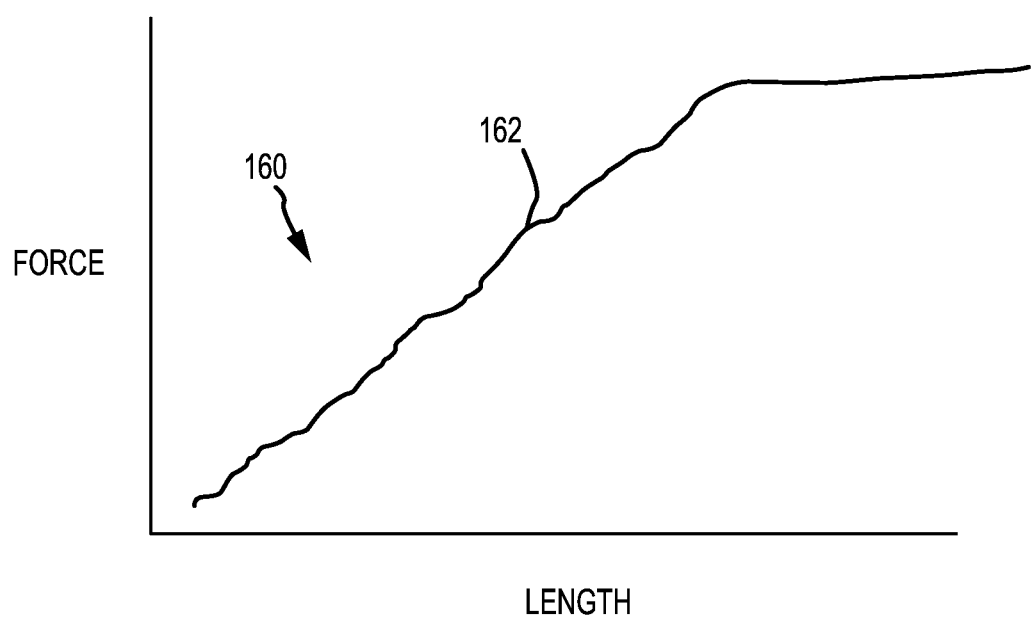
FIG. 4 is a plot illustrating force versus length of a ribbon.

The rollers 150 may be tuned to try to maintain a consistent growth rate or uniform cross-section of the ribbons 124. FIG. 4 illustrates a force versus length curve 160, with force on the vertical axis and length on the horizontal axis. The curve 160 is merely illustrative and as such, the length and force values are arbitrary. As shown, the curve 160 generally follows a straight line. The curve 160 does show minor deviations from a straight line which may indicate either excessive force or too little force was being exerted on the ribbon 124 as being affected by the solidification rate which is driven by temperature. As such, as the force curve 160 indicates a deviation from a straight line, a speed of the rollers 150 may either increase or decrease so that a desired amount of force is applied. Generally, the force required to pull the ribbon 124 may increase as the length of the ribbon increases. However, once the length of the ribbon 124 reaches a threshold level (for example, once the ribbon has reached a length that it extends out of the growth chamber 102 and is being supported by other mechanisms and/or is being cut, the curve may flatten out, as shown).

An example force perturbation that may result in a breakage is illustrated at 162. Such perturbations may generally be avoided through individual fine control of the rollers 150 to maintain a constant or linear curve. It is anticipated that the crucible 104 may have some variation in temperature, for example due to feeding in alumina, some ribbons 124 may grow faster or slower than others. As such, the individual control of sets of rollers 150 provides flexibility in the growth rates of the individual ribbons to help prevent breakage events and/or defective crystal growth.

Figure 5:
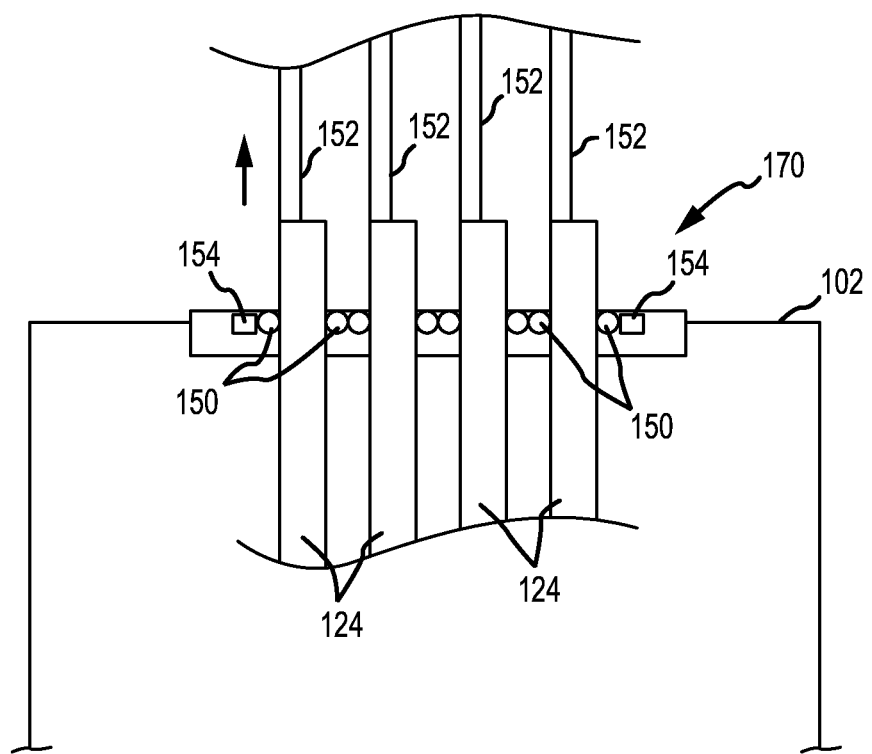
FIG. 5 illustrates an integrated pulling system in accordance with an alternative example embodiment.

FIG. 5 illustrates a pulling system 170 in accordance with an alternative embodiment. The pulling system 170 is integrated with the growth chamber 102. The pulling system 170 is configured to lower the leads 152 with rollers 150 to contact the molten alumina and propagate crystal growth. The rollers 150 then begin to pull the crystal ribbons 124 upwardly away from the crucible 104 and out of the growth chamber 102. As with the prior described embodiment, sensors 154 may be provided to sense the forces applied to the ribbons 124 and the rollers 150 may be controlled to apply a desired level of force to help avoid breakage of the ribbons and/or defective growth patterns.

The integrated pulling system 170 may advantageously reduce the amount of heat and gas loss associated with the convertible top embodiment discussed above. Additionally, it may provide for more exact control over the pulling rate, as each set of rollers 150 may be individually controlled throughout the entire growth process. As such, fewer defects and/or breakage events may occur in comparison with the more common pulling systems that have a single force feedback and control.

Figure 6:
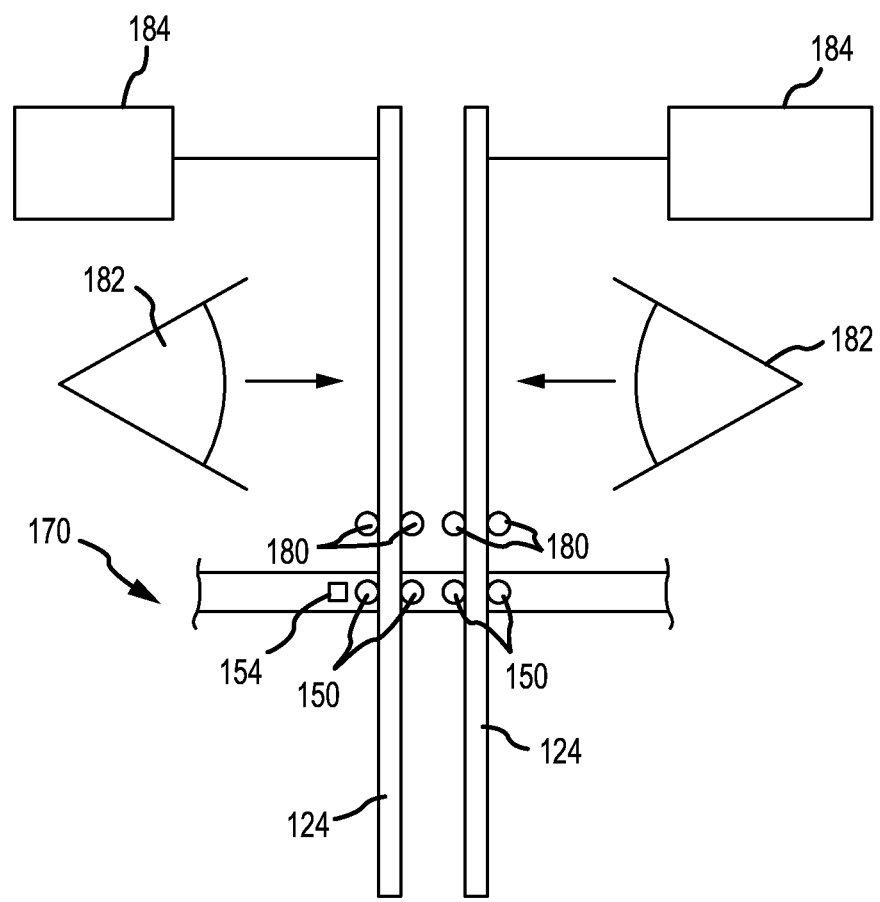
FIG. 6 illustrates a cutting system and a testing system for the continuous crystal growth system.

Multiple sets of rollers 150 may be provided to help stabilize and position the ribbons as they are pulled. In some embodiments, one set of rollers 150 may be included as part of the pulling system and a second (or more) set may be provided outside of the growth chamber 102 and pulling system. For example, a set of rollers 180 may be provided outside of the growth chamber 102 as illustrated in FIG. 6. The rollers 180 may have their own motors, but may be driven at speeds generally the same as those of the rollers 150. The rollers 180 may include their own sensors, in some embodiments, and may be controlled in accordance with the same force curve as rollers 150. In other embodiments, the rollers 180 may not be driven, but merely rotate as the ribbon 124 rolls in between the rollers.

The rollers 180 may help to decouple the growth of the crystal ribbons 124 from a cutting process. A cutting system may generally take the form of laser cutter 184 configured to cut the ribbons 124 as they are moving. As such, the cutter 184 may be configured to move with crystal ribbon in order to achieve a straight cut or alternatively may simply move laterally relative to the movement of the ribbon and achieve a diagonal cut of the ribbon. In other embodiments the cutter 184 may take the from of a mechanical device that may operate in accordance with a scribe and break technique, where a surface of the ribbon is scratched and then pressure or a thermal gradient is applied to cause fracture of the ribbon along the scratch line. In the cutting process, the ribbons 124 may be cut into discrete parts that may at least approximate the size and shape of a sapphire part for use for example in electronic devices.

In some embodiments, a vision test system 182 may be provided to scan the ribbons 124 for defects prior to cutting the ribbons. The vision test system 182 may generally take the form of a light based system that directs light or electromagnetic energy within a certain range of wavelengths towards the ribbons 124 and detects defects based on either reflected light patterns or light patterns that pass through the ribbons. In some embodiments, the vision test system may take the form of an infrared or ultraviolet sensor. In still other embodiments, a sensor other than a light based sensor may be implemented.

Figure 7:
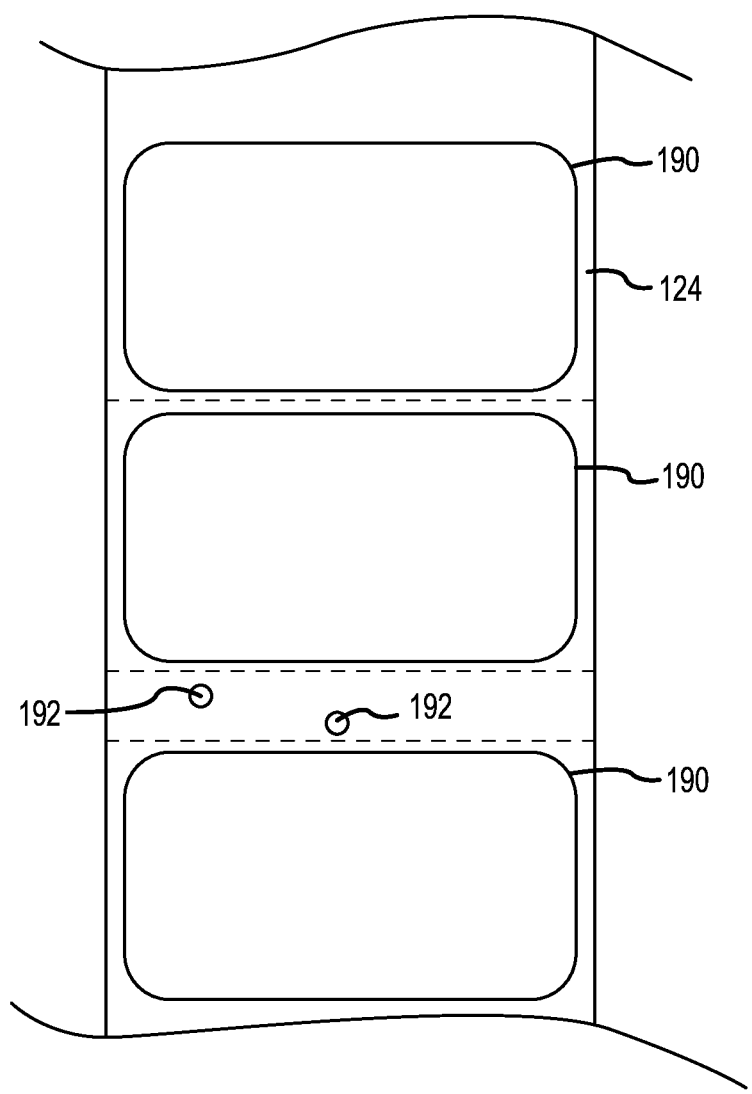
FIG. 7 illustrates a portion of a crystal ribbon having defects.

FIG. 7 illustrates a ribbon 124 with discrete part patterns 190 on the ribbon. Generally, the centermost part of the ribbon 124 is suitable for use. However, occasionally, gas bubbles 192 or other defects may be found in this region. With the vision test system 182, such defects 192 may be found and the ribbon 124 may be cut so that such defects do not become integrated into a part. Specifically, cuts may be made along the dashed lines to avoid integrating the defects into a part. Thus, the vision test system 182 helps to achieve an efficient use of the grown sapphire and reduce waste of the grown crystal.

Figure 8:
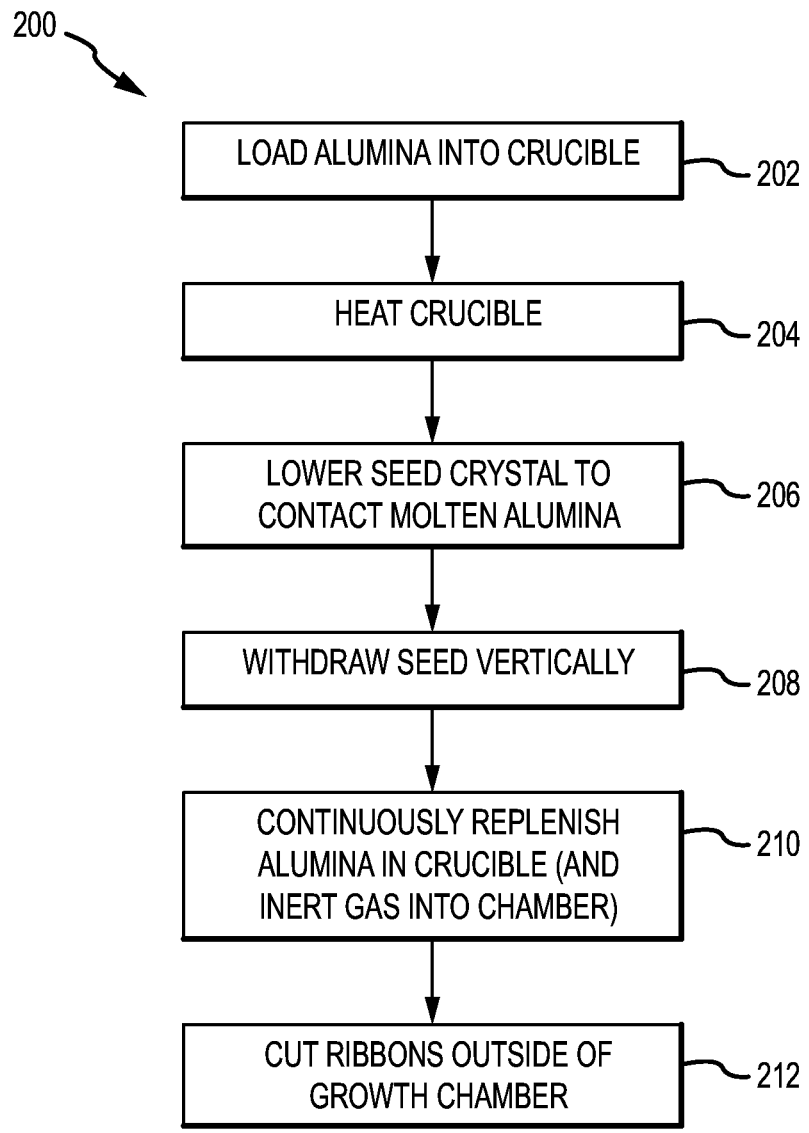
FIG. 8 is an example flowchart illustrating a method for continuous sapphire growth.

FIG. 8 is a flowchart illustrating an example method 200 for continuous sapphire growth in accordance with an example embodiment. Generally, the method may start with alumina being loaded into the crucible (Block 202) and heating the crucible (Block 204). The crucible is heated to beyond the melting point of alumina. A seed crystal is lowered on to touch on the die tips to begin crystallization of molten alumina (Block 206). The seed crystal is withdrawn vertically (Block 208) once crystal propagation starts. The crucible is continuously replenished through continuous feeding of alumina into the crucible (Block 210). Additionally, an inert gas such as argon may be fed into the chamber to replenish any gas that is escaping the chamber throughout the process. A cutting process then trims the ribbons into finite lengths above the top of the growth chamber (Block 218).

Although the foregoing discussion has presented specific embodiments, persons skilled in the art will recognize that changes may be made in form and detail without departing from the spirit and scope of the embodiments. Accordingly, the specific embodiments described herein should be understood as examples and not limiting the scope thereof.

We claim:

1. A method comprising:
    feeding a base material into a crucible located within a growth chamber;
    heating the crucible to melt the base material;
    initiating crystalline growth in the melted base material to create a crystal structure;
    lifting a pulling system within the growth chamber to pull the crystal structure away from the crucible, the pulling system comprising rollers; and
    after lifting the pulling system, engaging the rollers to feed the crystal structure out of the growth chamber.

2. The method of claim 1, wherein feeding the crystal structure out of the growth chamber comprises opening a top of the growth chamber.

3. The method of claim 1 further comprising:
    sensing a torque on the rollers pulling the crystal structure; and
    adjusting a speed at which the crystal structure is pulled and fed out of the growth chamber based on the sensed torque.

4. The method of claim 1 further comprising cutting the crystal structure after it is fed out of the growth chamber.

5. The method of claim 4, wherein the cutting step comprises a scribe and break process.

6. The method of claim 4, wherein the cutting process comprises a laser cutting process.

7. The method of claim 4, wherein the cutting process comprises:
    an inspection of the crystal structure to find defects; and
    excising the defective portions.

8. The method of claim 1, wherein initiating crystal growth comprises lowering a seed crystal within the growth chamber to contact the base material.

9. The method of claim 1 further comprising supplying an inert gas into the growth chamber.

10. A system for continuous sapphire growth comprising:
    a vertical growth chamber;
    a crucible positioned within the growth chamber, the crucible comprising a die set and configured to hold molten alumina;
    a heater configured to heat the crucible;
    a feeding system for continuously feeding alumina into the crucible; and
    a pulling system having a set of rollers attached thereto, the pulling system being vertically translatable within the growth chamber and configured to contact a seed crystal with molten alumina at the top of the die set, translate upward, and rotate the rollers to pull a crystal ribbon upwardly and out of the growth chamber.

11. The system of claim 10, wherein the growth chamber comprises a convertible top that opens to allow the crystal ribbon to exit the growth chamber.

12. The system of claim 11 further comprising one or more sealing members for creating a seal when the convertible top is open.

13. The system of claim 10, wherein the pulling system is located at the top of the growth chamber.

14. The system of claim 13, wherein the pulling system comprises a plurality of rollers for pulling the crystal ribbon upwardly from the crucible and out of the growth chamber.

15. The system of claim 14, wherein one or more of the plurality of rollers comprises a torque sensor.

16. The system of claim 10 further comprising an inspection unit outside of the growth chamber, wherein the inspection unit is configured to detect defects in the crystal ribbon.

17. The system of claim 16, wherein the inspection unit comprises a light based inspection system.

18. The system of claim 16 further comprising a cutting mechanism, wherein the cutting mechanism comprises one of a mechanical cutter or a laser cutter.

* * * * *